United States Patent [19]

Mizuhara

[11] Patent Number: 5,661,423
[45] Date of Patent: Aug. 26, 1997

[54] HIGH SPEED COMPARATOR CIRCUITS WITH OFFSET VOLTAGE COMPENSATION

[75] Inventor: Osamu Mizuhara, Allentown, Pa.

[73] Assignee: Lucent Technologies Inc., Murray Hill, N.J.

[21] Appl. No.: 572,594

[22] Filed: Dec. 14, 1995

[51] Int. Cl.[6] .................................................. H03K 5/153
[52] U.S. Cl. ........................... 327/74; 327/77; 327/307
[58] Field of Search ............................. 327/68, 71–74, 327/77, 89, 560–563, 307, 362

[56] References Cited

U.S. PATENT DOCUMENTS

| 5,030,850 | 7/1991 | Lunsford | 327/362 |
| 5,307,196 | 4/1994 | Kinoshita | 327/63 |
| 5,392,317 | 2/1995 | Cho et al. | 327/72 |

FOREIGN PATENT DOCUMENTS

| 9001233 | 2/1990 | WIPO | 327/307 |

*Primary Examiner*—Toan Tran
*Attorney, Agent, or Firm*—P. V. D. Wilde

[57] ABSTRACT

The specification describes a comparator circuit especially designed for high speed applications such as lightwave systems. The comparator is compensated for offset voltages due to current leakage and other variations in the IC components.

4 Claims, 2 Drawing Sheets

5,661,423

HIGH SPEED COMPARATOR CIRCUITS WITH OFFSET VOLTAGE COMPENSATION

FIELD OF THE INVENTION

The invention relates to high speed comparator circuits in which variations in power supply voltages, and other small drift voltage changes, are compensated.

BACKGROUND OF THE INVENTION

Very high speed comparator circuits used in lightwave applications, and other applications in which small signals are processed with high precision, are susceptible to errors due to voltage drift arising from a variety of sources, most notably power supply variations. The straightforward solution has been to identify the source of the transients and eliminate them or minimize their effect. Thus in the case of data errors due to power supply variations, the solution is to use more stable and more reliable power supplies. There are cost penalties in this approach, and even power supplies that meet rigorous IC specifications have been found to be the source of data errors in especially demanding circuits. Moreover, in the context of the performance demands addressed by this invention, many stabilized power supply circuits show unacceptable voltage drifts due to ambient and operational temperature changes.

STATEMENT OF THE INVENTION

According to this invention the transient voltage changes on the reference side of the comparator are compensated by the addition to the circuit of an op amp circuit that senses the transients on the reference side and inserts those same changes into the input side.

DETAILED DESCRIPTION

Figure 1:
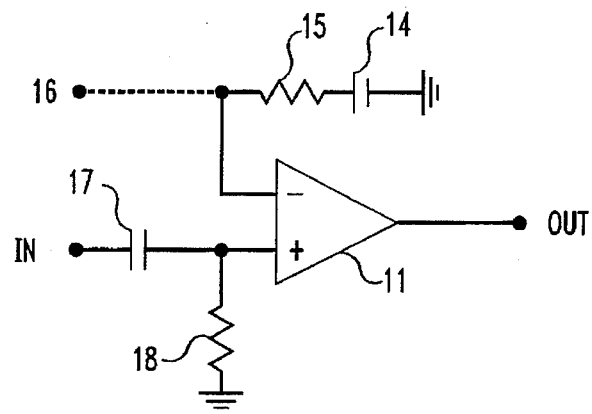
FIG. 1 is a generic comparator circuit describing the standard elements of a comparator circuit used in high speed data communications.

FIG. 1 shows a typical voltage comparator circuit with the comparator shown generally at 11, the input at 12 connected to the positive side of the comparator, with capacitor 13 and termination 14 as shown, and the reference voltage, $V_{ref}$, connected to the negative side of the comparator. The reference voltage is typically an internal voltage reference generator comprising DC source 14 and resistor 15 as shown. The signal being compared is connected through blocking capacitor 17 and termination impedance 18 to the positive side of the comparator as shown. Alternatively the comparator circuit may be used to compare the input signal with an off chip or external reference voltage 16, an option indicated by the dashed line connection. The reference and input signals can have polarities in reverse of those shown.

The output signal, designated "out" in FIG. 1, is typically the sum of the input and reference voltages.

Figure 2:
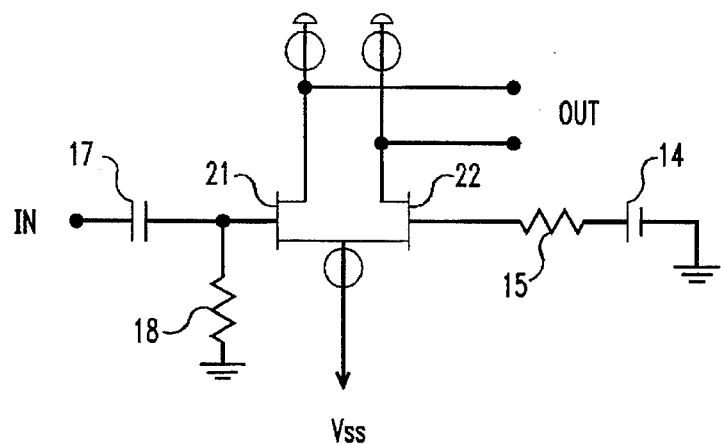
FIG. 2 shows a species of the generic circuit of FIG. 1 in which the input stage of the comparator circuit uses FET devices.

An exemplary comparator circuit having an FET input stage is shown in FIG. 2 and includes, in addition to the elements described in connection with FIG. 1, a pair of complimentary field-effect transistors 21 and 22. The input and reference voltages are connected to the gates of the pair of transistors as shown.

Figure 3:
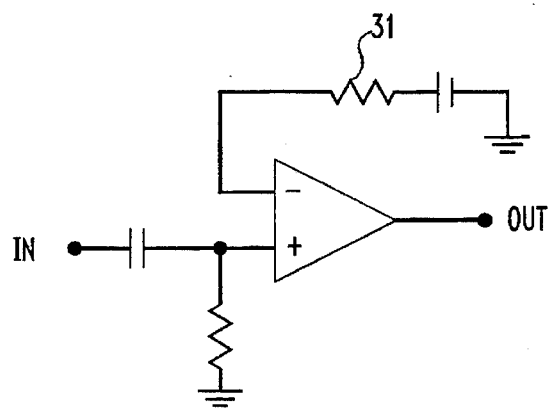
FIG. 3 shows a circuit similar to that of FIGS. 1 and 2 but has been modified to compensate for small voltage transients affecting the internal reference generator.

With reference to the circuit of FIG. 2, it is conventional to match as closely as possible the characteristics of the transistors. Typically they are GaAs or silicon transistor pairs, having a common substrate voltage Vss as shown, and sized and located on the chip in a symmetrical manner to give, as nearly as possible, the identical turn-on characteristics. Based on that assumption, transient voltage variations in the positive and negative inputs of the comparator will cancel if the input impedances are matched and if the gate leakage current is the same. This leads to the circuit solution of FIG. 3, in which the reference voltage has a termination impedance 31 that matches the termination impedance 18 of the input side. As shown, both impedances are 50 ohms, ±20 ohms, a typical value for high frequency line termination. This circuit arrangement tends to reduce the adverse effects of uncontrolled voltage variations but is still not wholly satisfactory. This is because the termination resistors themselves typically do not match due to process variations in forming them. It is possible to trim the resistors, improving the situation, but the trimming operation is expensive and of limited effectiveness, especially when using GaAs IC technology, generally the preferred technology for high speed lightwave applications. Moreover, tolerances typically allow a 20% variation, which is enough mis match to defeat the objective.

Figure 4:
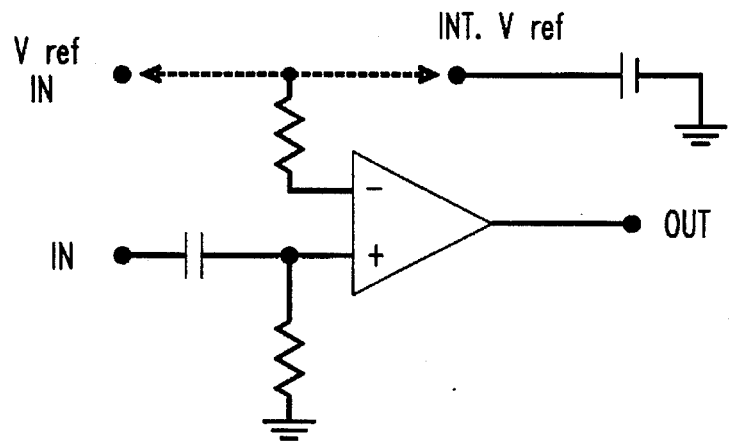
FIG. 4 is a circuit similar to that of FIG. 3 illustrating a comparator circuit designed with the option of an external reference signal.

The solution just described assumes an on-chip reference voltage. The option of comparing an off-chip reference can be added by the arrangement of FIG. 4. However, both the off-chip reference and the on-chip reference voltage source must have very low or zero impedance to preserve the impedance match discussed above.

In any of these arrangements the current leakage in the gate regions of the transistors is often large enough, and varies enough from transistor to transistor, that the transistor responses are not symmetrical and the voltage comparison shows an offset even if the termination impedances are exactly matched.

Figure 5:
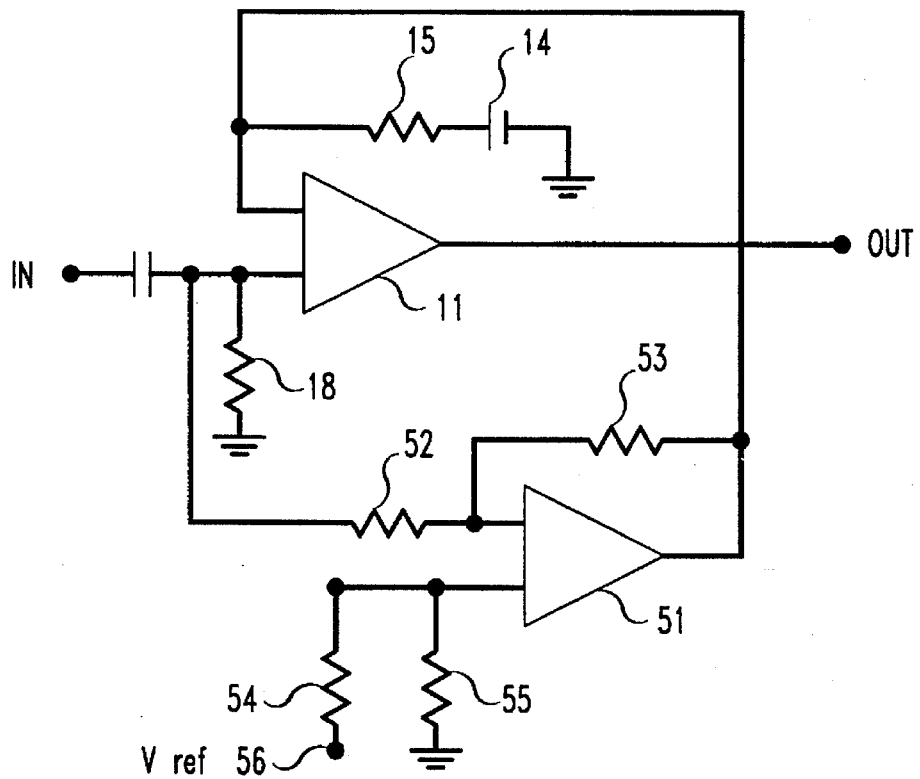
FIG. 5 is an improved comparator circuit according to this invention.

All of these asymmetric transient effects are addressed according to the invention by the circuit of FIG. 5. The basic comparator 11 is the same as that one described in connection with FIG. 1. The improvement results from the added op amp 51, which senses the actual error voltage in the input, and feeds that error voltage to the reference side of the comparator as shown, thus cancelling the actual error voltage. The resistors 52–55 are shown as 10 kohm, but may be any value that is large (e.g. 100× to 1000×) compared with termination impedance 18. The op amp 51 is in differential amp configuration and accommodates both an overdrive of the internal voltage reference 15 as well as an external reference voltage input at 56, which may be necessary in a communication system in order to accommodate the anticipated signal distortion at the input.

Characteristics of a typical op low offset op amp are as follows:

| | |
|---|---|
| Input Offset Voltage | 100 µVmax |
| Input Offset Current | 100 nA |
| Input Bias Current | ±100 nA |
| CCMR | 100 dB |
| Voltage Gain | 120 dB |
| Gain Bandwidth | 1 Mhz |

To demonstrate the effectiveness of the error voltage correction circuit a GaAs MESFET decision circuit was used. The decision circuit consisted of a high speed comparator and a D type flip-flop. An optimum reference voltage was measured for the best performance at 10Gb/s over various power supply voltages. While the power supply variation was within the IC specification it gave unsatisfactory results without the compensation of the invention. Table 1 on the following page shows the results.

TABLE 1

| Power Supply | Optimum with comp. ckt (V) | Optical Sensitivity (dBm) | Optimum w/o comp. ckt (V) | Optical Sensitivity (dBm) |
|---|---|---|---|---|
| Typ. −5% | −0.033 | −18 | −0.060 | −16 |
| Typ. | −0.032 | −18 | −0.066 | −18 |
| Typ. +5% | −0.031 | −18 | −0.074 | −16 |
| Offset Change | ±0.001 | ±0 | −0.006,±0.008 | ±2 |

The most critical measurement in the optical telecommunication system is a received optical sensitivity. It depends on the decision circuit optimum reference voltage stability. The result shown in Table 1 shows that the system with the compensation circuit of the invention suffered no optical sensitivity degradation, while it suffered 2dB degradation without the compensation circuit. The 2dB degradation over ±5% of power supply voltage change is not acceptable due to typical system margin allocation. The effectiveness of the invention in eliminating this unacceptable variation has thus been demonstrated.

While the invention is described above in the context of FET transistors it will be understood by those skilled in the art that the invention is equally adapted to improve bipolar comparator circuits.

Various additional modifications and deviations of the invention as described here will occur to those skilled in the art. All such variations, and their equivalents, that basically rely on the teachings through which this invention has advanced the art are properly considered within the scope of this disclosure and the appended claims.

I claim:

1. Circuit comprising:

a. a comparator with a signal voltage terminal on one side of the comparator, a reference voltage terminal on the other side of the comparator, and a comparator output terminal;

b. means for connecting an input signal through a blocking capacitor and to the signal voltage terminal of the comparator said signal voltage terminal being connected through a terminating impedance to ground;

c. means for connecting a first reference voltage to the reference voltage terminal;

d. an op amp having a first input, a second input, and an output, said first input connected through a high impedance to the input voltage terminal of the comparator; said second input adapted to be connected through a high series impedance to a second reference voltage source and through a terminating impedance to ground, and said op amp output connected to the reference voltage terminal of the comparator; and e. a high impedance connection between the voltage reference terminal and the first input of said op amp.

2. The circuit of claim 1 wherein the high impedances have values in the range of 100 to 1000 times the value of the terminating impedance.

3. The circuit of claim 1 wherein the means for connecting the reference voltage includes a DC voltage source and a series impedance.

4. The circuit of claim 2 wherein said terminating impedances have a value in the range 30 ohms to 60 ohms.

* * * * *